US008575594B2

United States Patent
Lee et al.

(10) Patent No.: US 8,575,594 B2
(45) Date of Patent: Nov. 5, 2013

(54) LIGHT EMITTING DIODE HAVING A BARRIER LAYER WITH A SUPERLATTICE STRUCTURE

(75) Inventors: Chung Hoon Lee, Ansan-si (KR); Ki Bum Nam, Ansan-si (KR); Dae Sung Kal, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 0 days.

(21) Appl. No.: 13/406,313

(22) Filed: Feb. 27, 2012

(65) Prior Publication Data

US 2012/0153259 A1  Jun. 21, 2012

Related U.S. Application Data

(63) Continuation of application No. 12/178,758, filed on Jul. 24, 2008, now Pat. No. 8,154,008.

(30) Foreign Application Priority Data

Sep. 10, 2007 (KR) .................. 10-2007-0091679

(51) Int. Cl.
  *H01L 29/06* (2006.01)
(52) U.S. Cl.
  USPC ............. 257/15; 257/13; 257/14; 257/79; 257/86; 257/94; 257/103; 257/E33.01; 257/E33.036; 257/E29.298; 438/46; 438/481
(58) Field of Classification Search
  USPC ............ 257/13, 15, 79, 86, 94, 103, E33.01, 257/E33.036, E29.288
  See application file for complete search history.

(56) References Cited

U.S. PATENT DOCUMENTS

| 6,040,588 | A | 3/2000 | Koide et al. |
| 6,060,335 | A | 5/2000 | Rennie et al. |
| 2003/0124789 | A1* | 7/2003 | Koide et al. .................. 438/200 |
| 2004/0113169 | A1 | 6/2004 | Asami et al. |
| 2004/0251471 | A1 | 12/2004 | Dwilinski et al. |
| 2004/0256611 | A1 | 12/2004 | Kim et al. |
| 2005/0179027 | A1* | 8/2005 | Kim et al. ...................... 257/14 |

(Continued)

FOREIGN PATENT DOCUMENTS

| EP | 2017900 | * | 1/2009 |
| JP | 10-135514 | | 5/1998 |

(Continued)

OTHER PUBLICATIONS

Extended European Search Report Dated Aug. 10, 2010.

(Continued)

*Primary Examiner* — A. Sefer
*Assistant Examiner* — Farid Khan
(74) *Attorney, Agent, or Firm* — H.C. Park & Associates, PLC

(57) ABSTRACT

A light emitting diode (LED) for minimizing crystal defects in an active region and enhancing recombination efficiency of electrons and holes in the active region includes non-polar GaN-based semiconductor layers grown on a non-polar substrate. The semiconductor layers include a non-polar N-type semiconductor layer, a non-polar P-type semiconductor layer, and non-polar active region layers positioned between the N-type semiconductor layer and the P-type semiconductor layer. The non-polar active region layers include a well layer and a barrier layer with a superlattice structure.

17 Claims, 3 Drawing Sheets

(56) References Cited

U.S. PATENT DOCUMENTS

| | | |
|---|---|---|
| 2005/0191778 A1 | 9/2005 | Ohtsuka et al. |
| 2006/0138431 A1 | 6/2006 | Dwilinski et al. |
| 2007/0063207 A1 | 3/2007 | Tanizawa et al. |
| 2007/0086498 A1* | 4/2007 | Ono et al. ............... 372/43.01 |
| 2007/0145406 A1 | 6/2007 | Han et al. |
| 2008/0093610 A1 | 4/2008 | Lee |
| 2008/0251780 A1 | 10/2008 | Li et al. |
| 2008/0251781 A1 | 10/2008 | Han et al. |
| 2009/0050875 A1* | 2/2009 | Kim et al. ................. 257/13 |
| 2009/0146160 A1* | 6/2009 | Nakahara ................. 257/94 |

FOREIGN PATENT DOCUMENTS

| | | | |
|---|---|---|---|
| JP | 2003-218396 | | 7/2003 |
| JP | 2007-157766 | | 6/2007 |
| KR | 10-2004-0016723 | | 2/2004 |
| KR | 10-0604406 | | 7/2006 |
| KR | 1020070072629 | * | 6/2008 |
| WO | 00/30178 | | 5/2000 |
| WO | 01-39282 | | 5/2001 |
| WO | 02/097904 | | 12/2002 |
| WO | 2005-101532 | | 10/2005 |
| WO | 2006/022497 | | 3/2006 |
| WO | WO 2007/063920 | * | 6/2007 |
| WO | 2008/082081 | | 7/2008 |

OTHER PUBLICATIONS

Non-Final Office Action of U.S. Appl. No. 12/057,842 issued on Sep. 17, 2010.
Final Office Action of U.S. Appl. No. 12/057,842 issued on Apr. 29, 2011.
Non-Final Office Action of U.S. Appl. No. 12/057,842 issued on Sep. 2, 2011.
Non-Final Office Action of U.S. Appl. No. 12/517,314 issued on Jun. 2, 2011.
Final Office Action of U.S. Appl. No. 12/517,314 issued on Sep. 7, 2011.
Notice of Allowance of U.S. Appl. No. 12/517,314 issued on Oct. 27, 2011.
Non-Final Office Action of U.S. Appl. No. 12/178,758 issued on Jul. 20, 2009.
Non-Final Office Action of U.S. Appl. No. 12/178,758 issued on Jan. 11, 2010.
Non-Final Office Action of U.S. Appl. No. 12/178,758 issued on Nov. 12, 2010.
Final Office Action of U.S. Appl. No. 12/178,758 issued on Apr. 7, 2011.
Non-Final Office Action of U.S. Appl. No. 12/178,758 issued on Jul. 22, 2011.
Notice of Allowance of U.S. Appl. No. 12/178,758 issued on Nov. 28, 2011.

* cited by examiner

US 8,575,594 B2

LIGHT EMITTING DIODE HAVING A BARRIER LAYER WITH A SUPERLATTICE STRUCTURE

CROSS REFERENCE TO RELATED APPLICATION

This application is a continuation of U.S. patent application Ser. No. 12/178,758, filed on Jul. 24, 2008, and claims priority from and the benefit of Korean Patent Application No. 10-2007-0091679, filed on Sep. 10, 2007, which are hereby incorporated by reference for all purposes as if fully set forth herein.

BACKGROUND OF THE INVENTION

1. Field of the Invention

The present invention relates to a light emitting diode formed through growth of non-polar GaN-based semiconductor layers, and more particularly, to a non-polar light emitting diode having a barrier layer with a superlattice structure.

2. Discussion of the Background

In general, since Group-III-element nitrides, such as GaN, AlN and InGaN, have excellent thermal stability and a direct-transition-type energy band structure, they have recently come into the spotlight as materials for light emitting diodes (LEDs) in blue and ultraviolet regions. Particularly, an InGaN compound semiconductor has been noticed for its narrow band gap. LEDs using such a GaN-based compound semiconductor are used in various applications such as large-sized full-color flat panel displays, backlight sources, traffic lights, indoor illumination, high-density light sources, high-resolution output systems and optical communications.

FIG. 1 is a sectional view illustrating a conventional LED.

Referring to FIG. 1, the LED includes an N-type semiconductor layer 17, a P-type semiconductor layer 21, and an active region 19 interposed between the N-type and P-type semiconductor layers 17 and 21. The N-type and P-type semiconductor layers 17 and 21 include Group-III-element nitride semiconductor layers, i.e., (Al, In, Ga)N-based compound semiconductor layers. Meanwhile, the active region 19 has a single quantum well structure having a single well layer, or a multiple quantum well structure having a plurality of well layers, as shown in this figure. The active region 19 with a multiple quantum well structure includes alternately laminating InGaN well layers 19a and GaN barrier layers 19b. The well layer 19a includes a semiconductor layer with a smaller band gap than the N-type and P-type semiconductor layers 17 and 19 and the barrier layer 19b, thereby providing quantum wells in which electrons and holes are recombined with each other.

Such a Group-III-element nitride semiconductor layer is grown on a different-type substrate 11 with a hexagonal system structure, such as sapphire or SiC, using a method such as organic chemical vapor deposition (MOCVD). However, if a Group-III-element nitride semiconductor layer is grown on the different-type substrate 11, a crack or warpage occurs in the semiconductor layer and dislocation is produced due to the difference of lattice coefficients and thermal expansion coefficients between the semiconductor layer and the substrate.

In order to prevent these problems, a buffer layer is formed on the substrate 11. The buffer layer generally includes a low-temperature buffer layer 13 and a high-temperature buffer layer 15. The low-temperature buffer layer 13 is generally formed of $Al_xGa_{1-x}N(0 \leq x \leq 1)$ at a temperature of 400 to 800° C. using a method such as MOCVD. The high-temperature buffer layer 15 is then formed on the low-temperature buffer layer 13. The high-temperature buffer layer 15 is formed of a GaN layer at a temperature of 900 to 1200° C. Accordingly, crystal defects in the N-type GaN layer 17, the active region 19, and the P-type GaN layer 21 can be reduced.

However, although the low-temperature and high-temperature buffer layers 13 and 15 are employed, crystal defect density in the active region 19 is still high. Particularly, to enhance a bonding efficiency of electrons and holes, the active region 19 includes a semiconductor layer with a smaller band gap than the N-type and P-type GaN layers 17 and 19. In addition, the well layer 19a includes a semiconductor layer with a smaller band gap than the barrier layer 19b. The semiconductor layer with a small band gap generally contains a large amount of In and thus has a large lattice coefficient. Therefore, lattice mismatch occurs between the well layer 19a and the barrier layer 19b and between the well layer 19a and the N-type semiconductor layer 17. Such lattice mismatch between the layers causes pin holes, surface roughness, and degradation of crystal structures.

Meanwhile, GaN and its compounds are the most stable in a hexagonal system crystal structure expressed by axes of equivalent bases, which rotate at an angle of 120 degrees with respect to each other and are all perpendicular to the unique c-axis as shown in FIG. 2. Referring to FIG. 2, as a result of positions of gallium and nitrogen atoms in the crystal structure, each plane contains only one kind of atom, i.e., Ga or N while advancing along the c-axis plane by plane. To maintain charge neutrality, GaN crystals form the boundary between one c-plane containing only nitrogen atoms and one c-plane containing only gallium atoms. As a result, the GaN crystals are polarized along the c-axis, and the voluntary polarization of the GaN crystals depends on the crystal structure and composition as bulk properties.

Since it is relatively easy to grow c-plane {0001} containing Ga atoms, almost all conventional GaN-based LEDs are grown in parallel with a polar c-axis. In addition, interface stress between different kinds of layers may additionally cause piezoelectric polarization. The total polarization is the sum of voluntary polarization and piezoelectric polarization.

The conventional GaN-based LED includes GaN-based semiconductor layers grown along a c-axis direction. However, due to strong piezoelectric polarization and voluntary polarization, c-plane quantum well structures of the LED are influenced by a quantum-confined stark effect (QCSE) in an active region. Further, electrons and holes are spatially separated by strong internal electric fields along the c-direction, so that recombination efficiency of electrons and holes is reduced.

Accordingly, there is an interest in enhancing recombination efficiency of electrons and holes in an active region and in solving problems associated with lattice mismatch between a well layer with a multiple quantum well structure and an N-type semiconductor layer.

SUMMARY OF THE INVENTION

This invention provides an LED for minimizing generation of crystal defects in an active region and enhancing recombination efficiency of electrons and holes in the active region.

Additional features of the invention will be set forth in the description which follows, and in part will be apparent from the description, or may be learned by practice of the invention.

The present invention discloses an LED including non-polar GaN-based semiconductor layers grown on a non-polar substrate, wherein the semiconductor layers include a non-polar N-type semiconductor layer, a non-polar P-type semiconductor layer, and active region layers positioned between the N-type and P-type semiconductor layers. In addition, the active region layers have a structure having a well layer and a barrier layer with a superlattice structure. The non-polar GaN-based semiconductor layers are used, thereby enhancing recombination efficiency of electrons and holes in an active region having the active region layers. In addition to the enhanced recombination efficiency of electrons and holes, the barrier layer with a superlattice structure is employed in the active region, thereby minimizing occurrence of defects caused by lattice mismatch between well and barrier layers.

In the specification, the term "active region layer" is defined as any one of a plurality of layers positioned in an active region. In addition, the term "non-polar substrate" or "substrate" having the meaning similar thereto is defined as a substrate having an r-, m- or a-plane on which a non-polar a- or m-plane GaN-based compound is grown.

The well layer may be formed of InGaN, and the barrier layer may have a superlattice structure in which InGaN and GaN layers are alternately laminated. InGaN of the well layer may contain a larger amount of In than that of the barrier layer. Accordingly, an LED emitting light with various wavelengths in a visual light region is possible by changing an In content in the well layer.

Meanwhile, as InGaN in the barrier layer contains an increased amount of In, the number of pin holes is reduced, but hillrocks may be produced. It is understood that this is because pin holes are filled with In to prevent them from occurring, but if In is excessively increased, hillrocks are produced by surplus In. Accordingly, the In content of InGaN in the barrier layer is appropriately selected to prevent pin holes and hillrocks from occurring.

In some embodiments, the well layer is formed of $In_xGa_{(1-x)}N$, and the barrier layer includes a lower superlattice having $In_yGa_{(1-y)}N$ and GaN alternately laminated, an upper superlattice having $In_yGa_{(1-y)}N$ and GaN alternately laminated, and a middle superlattice interposed between the lower and upper superlattices and having $In_zGa_{(1-z)}N$ and GaN alternately laminated, where $0<x<1$, $0<y<0.05$, $0<z<0.1$ and $y<z<x$. Here, a superlattice with a large In content is disposed between superlattices with a small In content. Accordingly, superlattices with different In contents are laminated, thereby reducing pin holes and hillrocks.

In addition, the well and barrier layers may be formed in plurality, and the plurality of well layers and the plurality of barrier layers are alternately laminated, whereby an active region with a multiple quantum well structure may be formed.

According to an embodiment of the present invention, the GaN-based semiconductor layers may be a-plane GaN-based semiconductor layers grown using an r-plane sapphire substrate or an a-GaN substrate as the non-polar substrate, or m-plane GaN-based semiconductor layers grown using an m-plane sapphire substrate or an m-GaN substrate as the non-polar substrate.

The P-type semiconductor layer may include a P-type clad layer positioned on the uppermost one of the active region layers; a hole injection layer positioned on the P-type clad layer; and a P-type contact layer positioned on the hole injection layer. A doping concentration of the hole injection layer may be lower than that of the P-type clad layer, and a doping concentration of the P-type contact layer may be higher than that of the P-type clad layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
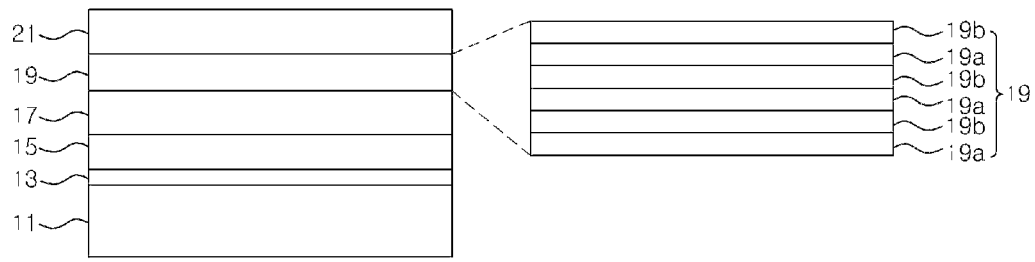
FIG. 1 is a sectional view illustrating a conventional LED.

Hereinafter, embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements may be exaggerated for convenience of illustration Like reference numerals indicate like elements throughout the specification and drawings.

Figure 3:
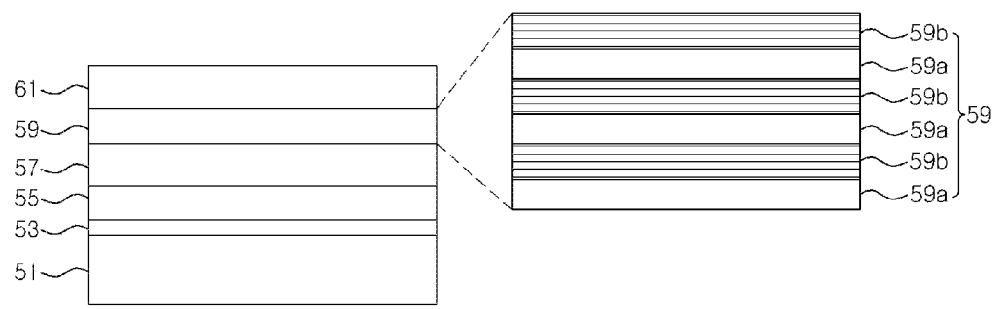
FIG. 3 is a sectional view illustrating an LED according to an embodiment of the present invention.

FIG. 3 is a sectional view illustrating an LED according to an embodiment of the present invention.

Referring to FIG. 3, an N-type compound semiconductor layer 57 is positioned on top of a substrate 51. Also, a buffer layer may be interposed between the substrate 51 and the N-type semiconductor layer 57, and the buffer layer may include a low-temperature buffer layer 53 and a high-temperature buffer layer 55. The low-temperature buffer layer 53 may be generally formed of $Al_xGa_{1-x}N$ ($0 \leq x \leq 1$), and the high-temperature buffer layer 55 may be formed of, for example, undoped GaN or n-type GaN doped with an n-type impurity.

A P-type compound semiconductor layer 61 is positioned on top of the N-type compound semiconductor layer 57, and an active region 59 is interposed between the N-type and P-type compound semiconductor layers 57 and 61. The N-type compound semiconductor layer 57, layers of the active region 59 (hereinafter, referred to as "active region layers") and the P-type compound semiconductor layer 61 may be formed of an (Al, In, Ga)N-based Group-III nitride semiconductor. For example, the N-type compound semiconductor layer 57 and the P-type compound semiconductor layer 61 may be formed of N-type GaN and P-type GaN, respectively.

Figure 2:
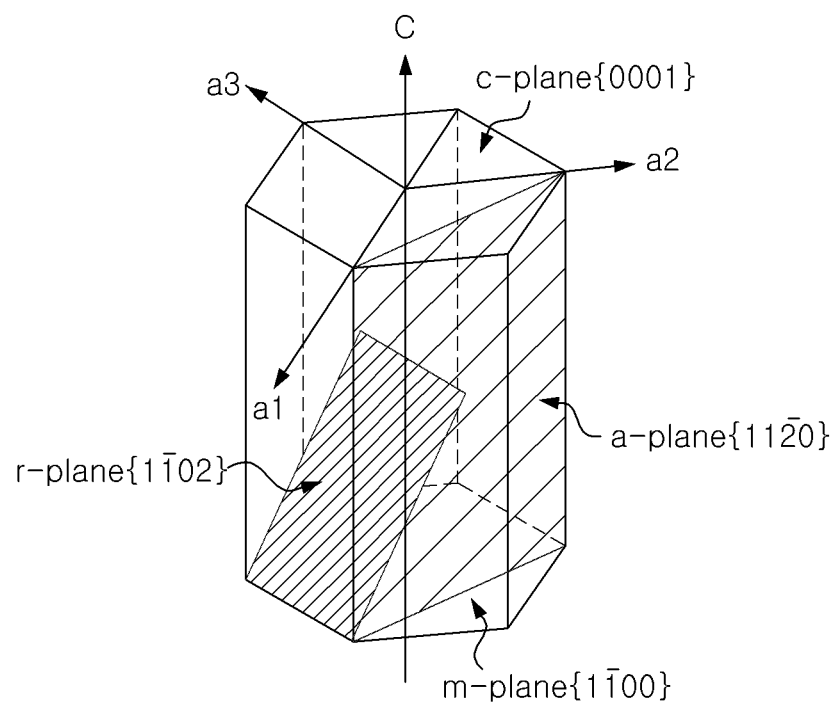
FIG. 2 is view of a hexagonal system structure illustrating a growth surface and growth direction of a GaN-based semiconductor layer.

The substrate 51 is a non-polar substrate, and in this embodiment, an r-plane {1$\bar{1}$02} (see FIG. 2) sapphire substrate is used as the substrate 51. The N-type compound semiconductor layer 57, the P-type compound semiconductor layer 61, the active region layers, and further, the buffer layers 53 and 55, are grown on the r-plane sapphire substrate, thereby forming non-polar GaN-based semiconductor layers, particularly a-plane $\{11\bar{2}0\}$ (see FIG. 2) GaN-based semiconductor layers. The non-polar GaN-based semiconductor layers at least include the non-polar N-type compound semiconductor layer 57, the non-polar P-type semiconductor layer 61, and the non-polar active region layers positioned in the active region 59 between the non-polar N-type and P-type compound semiconductor layers 57 and 61. As will be described in detail later, the active region layers include at least a well layer and at least a superlattice barrier layer.

Instead of the r-plane sapphire substrate, an a-GaN substrate having the a-plane $\{11\bar{2}0\}$ as a growth plane may be used as the substrate 51. At this time, the a-GaN substrate may be grown on the r-plane sapphire substrate.

Instead of the r-plane sapphire substrate or a-GaN substrate, an m-plane $\{1\bar{1}00\}$ (see FIG. 2) sapphire substrate or m-GaN substrate may also be used as the non-polar substrate 51. The non-polar GaN-based semiconductor layers grown on such a non-polar substrate 51 become m-plane GaN-based semiconductor layers. For example, a method for growing non-polar GaN-based semiconductor layers on an r-plane or m-plane sapphire substrate or an a-GaN or m-GaN substrate may include hydride vapor phase epitaxy (HVPE), metal organic chemical vapor deposition (MOCVD), molecular beam epitaxy (MBE), liquid phase epitaxy (LPE), plasma-enhanced chemical vapor deposition (PECVD), and the like.

Since heterointerfaces are parallel with a polar c-axis, the non-polar GaN-based semiconductor layers obtained as described above remove or reduce an electromagnetic field induced by polarization that reduces the recombination rate of electrons and holes in an active region 59, so that recombination efficiency of electrons and holes in the active region 59 is improved, thereby enhancing quantum efficiency.

Referring back to FIG. 3, the active region 59 includes active region layers having well layers 59a and barrier layers 59b with a superlattice structure. The active region 59 may have a single quantum well structure having a single well layer 59a. Thus, the barrier layer 59b with a superlattice structure is positioned over and/or under the well layer 59a. As shown in this figure, the active region 59 may have a multiple quantum well structure, in which the well layers 59a and the barrier layers 59b with a superlattice structure are alternately laminated. That is, the well layers 59a of InGaN and the barrier layers 59b are alternately laminated on the N-type compound semiconductor layer 57, and the barrier layer 59b has a superlattice structure in which InGaN and GaN are layers alternately laminated. InGaN in the well layer 59a has an In content larger than the InGaN in the barrier layer 59b so that quantum wells are formed.

The barrier layer 59b may have a superlattice structure, thereby preventing or reducing crystal defects such as dislocation and pin holes from occurring due to the lattice mismatch between the InGaN well layer and the GaN barrier layer. Moreover, if the In content of InGaN in the barrier layer 59b is increased, pin holes can be reduced or prevented from occurring, but hillrocks may occur. It is understood that this is because the hillrocks are formed due to surplus In that remains on an InGaN layer. Accordingly, pin holes and hillrocks can be reduced or prevented from occurring by appropriately controlling the In content in the barrier layer 59b, and an In composition ratio of the InGaN layer can be adjusted in a range of 0.01 to 0.1.

Meanwhile, in some embodiments of the present invention, a barrier layer with a superlattice structure for preventing pin holes and hillrocks from occurring may include InGaNs having different In contents, which will be described in detail below.

Figure 4:
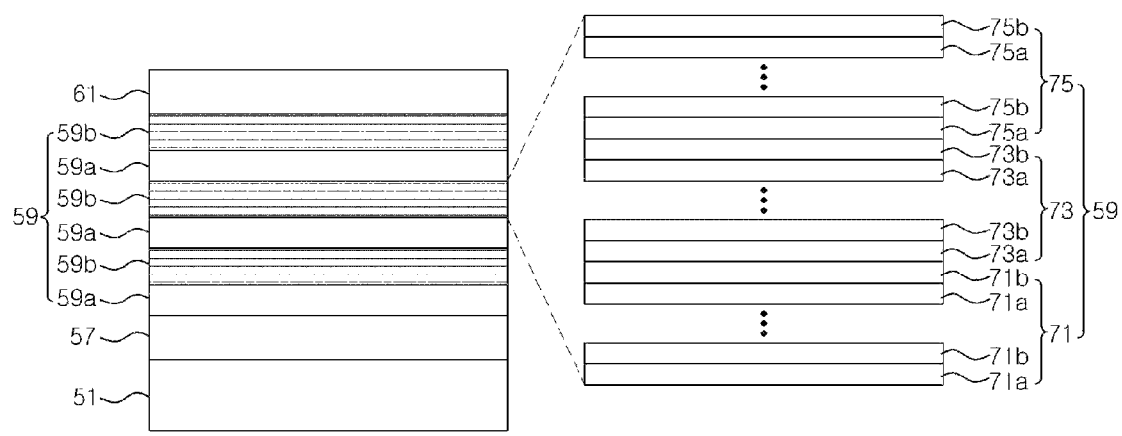
FIG. 4 is a sectional view illustrating a barrier layer with a superlattice structure according to an embodiment of the present invention.

FIG. 4 is an enlarged sectional view of the active region of FIG. 3 for illustrating a barrier layer with a superlattice structure including InGaN with different In contents according to an embodiment of the present invention.

Referring to FIG. 4, the well layer 59a may be expressed by $In_xGa_{(1-x)}N$, where $0<x<1$. Meanwhile, the barrier layer 59b with the superlattice structure may include a lower superlattice 71 having $In_yGa_{(1-y)}N$ layers 71a and GaN layers 71b alternately laminated, an upper superlattice 75 having $In_yGa_{(1-y)}N$ layers 75a and GaN 75b layers alternately laminated, and a middle superlattice 73 interposed between the lower and upper superlattices 71 and 75. The middle superlattice 73 is formed by alternately laminating $In_zGa_{(1-z)}N$ and GaN layers. Here, $0<x<1$, $0<y<0.05$, $0<z<0.1$ and $y<z<x$.

The $In_yGa_{(1-y)}N$ layers 71a and 75a of the lower and upper superlattices 71 and 75 have an In content smaller than the $In_zGa_{(1-z)}N$ layers 73a in the middle superlattice 73. Hence, fine pin holes may be formed in a process of forming the lower superlattice 71. However, the middle superlattice 73 formed thereafter contains surplus In, so that the pin holes may be filled with the surplus In to remove the pin holes. Meanwhile, the surplus In in the middle superlattice 73 may generate hillrocks. Such surplus In may be removed by the upper superlattice 75. According to this embodiment, pin holes and hillrocks can be reduced or prevented from occurring by employing the superlattice structure containing InGaNs with a small In content and a superlattice structure containing InGaN with a large In content.

The InGaN and GaN layers in the lower, middle and upper superlattices 71, 73 and 75 are alternately laminated. A pair of the InGaN and GaN layers may be repeatedly laminated four to ten times in the lower superlattice 71, six to twenty times in the middle superlattice 73, and four to ten times in the upper superlattice 75. The number of laminated InGaN and GaN layers may be varied depending on thicknesses of the InGaN and GaN layers and an In content in the InGaN layer, and is set to control the occurrence of pin holes and hillrocks.

Although it has been described in this embodiment that the InGaN layer in the lower and upper superlattices 71 and 75 has an In content smaller than the InGaN layer in the middle superlattice 73, the InGaN layer in the lower and upper superlattices 71 and 75 may have a In content greater than the InGaN layer in the middle superlattice 73. That is, an In composition ratio in the well and barrier layers may satisfy $0<x<1$, $0<y<0.1$, $0<z<0.05$ and $z<y<x$.

The InGaN and GaN layers in the lower, middle and upper superlattices 71, 73 and 75 may be formed at a temperature of 800 to 900° C. by an MOCVD method. The InGaN and GaN layers in the barrier layer 59b may have a thickness of 2.5 to 20 Å, and they may be formed to have almost the same thickness.

Figure 5:
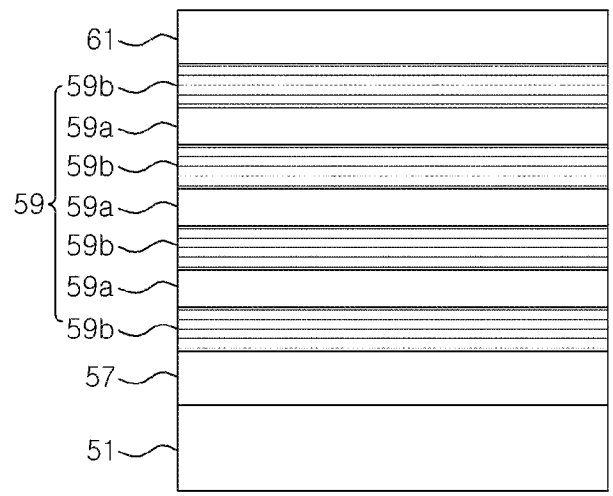
FIG. 5 is a sectional view illustrating an LED having a barrier layer with a superlattice structure according to an embodiment of the present invention.

Although it is shown in FIG. 4 that the N-type compound semiconductor layer 57 and the well layer 59a contact each other, the barrier layer 59b with the superlattice structure described with reference to FIG. 4 may be interposed between the N-type compound semiconductor layer 57 and the well layer 59a, which is shown in FIG. 5. The barrier layer 59b interposed between the N-type compound semiconductor layer 57 and the well layer 59a may reduce strain caused by the lattice mismatch between the N-type compound semiconductor layer 57 and the well layer 59a, thereby reducing or preventing crystal defects from occurring in the well layer 59a.

In the embodiments of the present invention, the positions of the N-type and P-type compound semiconductor layers 57 and 61 may be changed with each other.

In the LED according to the embodiments as described above, the aforementioned non-polar structure of GaN-based semiconductor layers may improve the recombination efficiency of electrons and holes, so that the quantum efficiency is considerably improved. Further, a superlattice barrier layer is employed in an active region, thereby obtaining active region layers that have more reduced defects such as pin holes and roughness smoother than in the prior art.

Figure 6:
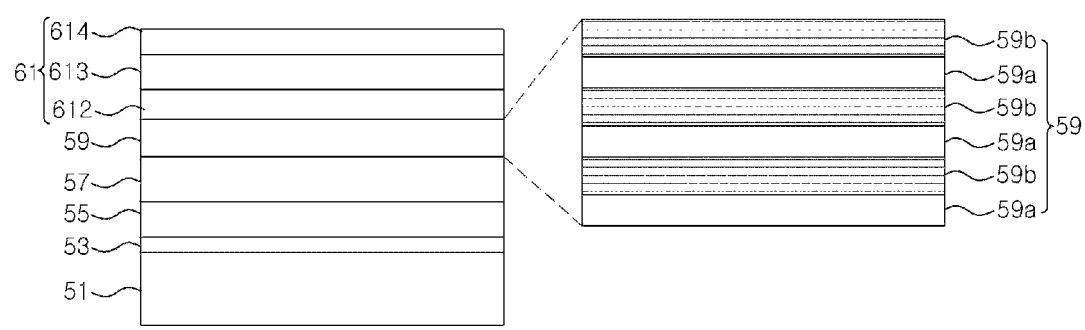
FIG. 6 is a sectional view illustrating an LED having a P-type semiconductor layer including a hole injection layer according to an embodiment of the present invention.

FIG. 6 is a sectional view illustrating an LED according to an embodiment of the present invention. Like the LED of the previous embodiments, the LED of this embodiment shown in FIG. 6 has a structure including non-polar GaN-based semiconductor layers grown on a non-polar substrate 51. Among the GaN-based semiconductor layers, an active region layer has a structure including a superlattice barrier layer 59b together with a well layer 59a. However, the LED of this embodiment is different from the previous embodiments in that the non-polar structure of the aforementioned embodiment and a structure for enhancing recombination efficiency of electrons and holes are included in a P-type semiconductor layer 61.

Referring to FIG. 6, the P-type semiconductor layer 61 of this embodiment includes a non-polar P-type clad layer 612, a hole injection layer 613, and a P-type contact layer 614. The bandgap of the P-type clad layer 612 is wider than that of the hole injection layer 613, and the bandgap of the hole injection layer 613 is equal or about equal to that of the P-type contact layer 614. Since the bandgaps of the P-type contact layer 614 and the hole injection layer 613 are the same or about the same, a current flowing from an electrode (not shown) is spread in the P-type contact layer 614 and may then flow into the hole injection layer 613 with no energy barrier. Since the P-type clad layer 612 is formed of a semiconductor having a wide bandgap to confine electrons in an active region 59 and has a bandgap relatively wider than the hole injection layer 613, the P-type clad layer 612 helps a current to be spread in the hole injection layer 613.

Meanwhile, a doping concentration of the hole injection layer 613 may be lower than that of the P-type clad layer 612, and a doping concentration of the P-type contact layer 614 may be higher than that of the P-type clad layer 612. The P-type contact layer 614 is a layer in contact with a conductive electrode (not shown) made of ITO or a metallic material and is doped with impurities at a high concentration to lower contact resistance between the conductive electrode and the P-type contact layer 614.

However, the hole injection layer 613 is a layer that produces holes injected into the active layer 59, and if a doping concentration of the hole injection layer 613 is high, the mobility of holes may be decreased in the hole injection layer 613. Thus, by setting a doping concentration of the hole injection layer 613 to be lower than that of the P-type contact layer 614, the mobility of holes can be enhanced. The P-type clad layer 612 also has a doping concentration lower than the P-type contact layer 614 to smooth out the movement of holes. The holes produced in the hole injection layer 613 are injected into the active region 59 via the P-type clad layer 612. By setting a doping concentration of the P-type clad layer 612 to be higher than that of the hole injection layer 613, the movement of holes from the hole injection layer 613 to the P-type clad layer 612 can be promoted.

Although not shown, an undoped layer may be interposed between the uppermost layer among the aforementioned layers of the active region 59 and the P-type clad layer 612, thereby reducing or preventing an impurity with which the P-type clad layer 612 is doped, e.g., Mg, from diffusing into the active region 59.

An undoped layer may also be interposed between the P-type clad layer 612 and the hole injection layer 613 and/or between the hole injection layer 613 and the P-type contact layer 614. Such undoped layers may be formed of the same semiconductor as the hole injection layer without intentional doping. For example, the undoped layers may be formed of GaN.

The undoped layer between the P-type clad layer 612 and the hole injection layer 613 may be grown by blocking an injection of source gas of Al and In after growing the P-type clad layer 612 of AlInGaN in a reaction chamber. The undoped layer prevents hydrogen of $NH_3$ from combining with impurities in the P-type clad layer 612 while being grown. Further, the undoped layer prevents hydrogen from combining with impurities in the P-type clad layer 612 while injecting $NH_3$ gas before the hole injection layer 613 is formed through an in-situ process. Accordingly, the activation of Mg in the P-type clad layer 612 can be enhanced.

The undoped layer between the hole injection layer 613 and the P-type contact layer 614 prevents hydrogen from combining with impurities in the hole injection layer 613 before the P-type contact layer 614 is formed, thereby helping the activation of the impurities in the hole injection layer 613.

According to embodiments of the present invention, a non-polar structure of GaN-based semiconductor layers is employed, so that it is possible to improve recombination efficiency of electrons and holes in an active region and accordingly to enhance quantum efficiency. Further, a barrier layer with a superlattice structure is employed together with a well layer in the active region, so that it is possible to provide an LED having reduced defects such as pin holes in the active region and improved surface roughness. Furthermore, it is possible to provide an LED, in which it is possible to prevent pin holes from occurring in the active region and to control occurrence of hillrocks.

In addition, the structure of a P-type semiconductor layer including a hole injection layer is employed together with the non-polar structure and the superlattice barrier layer structure in the active region, so that recombination efficiency of electrons and holes in the active region can be improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A light emitting diode (LED), comprising non-polar GaN-based semiconductor layers grown on a non-polar substrate, wherein the non-polar GaN-based semiconductor layers comprise:

a non-polar N-type semiconductor layer;

a non-polar P-type semiconductor layer; and non-polar active region layers positioned between the non-polar N-type semiconductor layer and the non-polar P-type semiconductor layer, wherein the non-polar active region layers comprise a well layer and a barrier layer, wherein the P-type semiconductor layer comprises a P-type clad layer positioned on the active region layers, an undoped layer interposed between the uppermost layer of the non-polar active region layers and the P-type clad layer, a hole injection layer positioned on the P-type clad layer, and a P-type contact layer positioned on the hole injection layer.

2. The LED as claimed in claim 1, wherein a doping concentration of the hole injection layer is lower than a doping concentration of the P-type clad layer, and a doping concentration of the P-type contact layer is higher than the doping concentration of the P-type clad layer.

3. The LED as claimed in claim 1, wherein the barrier layer's thicknesses is less than 50 Å.

4. The LED as claimed in claim 3, wherein the barrier layer comprises a superlattice structure.

5. The LED as claimed in claim 4, wherein the each layer of superlattice structure have a thickness of 2.5 to 20 Å.

6. The LED as claimed in claim 5, wherein the superlattice structure has a pair of two layers laminated four to ten times.

7. The LED as claimed in claim 4, wherein the well layer comprises InGaN, the barrier layer comprises the superlattice structure in which an InGaN layer and an GaN layer are alternately laminated, and InGaN in the well layer comprises a larger amount of In than an amount of InGaN in the barrier layer.

8. The LED as claimed in claim 4, wherein the well layer comprises $In_xGa_{(1-x)}N$, and the barrier layer comprises a lower superlattice having $In_yGa_{(1-y)}N$ and GaN alternately laminated, an upper superlattice having $In_yGa_{(1-y)}N$ and GaN alternately laminated, and a middle superlattice interposed between the lower superlattice and the upper superlattice, the middle superlattice having $In_zGa_{(1-z)}N$ and GaN alternately laminated, where $0<x<1$, $0<y<0.05$, $0<z<0.1$ and $y<z<x$.

9. The LED as claimed in claim 1, wherein the non-polar active region layers comprise a plurality of well layers and a plurality of barrier layers alternately laminated to form an active region of a multiple quantum well structure.

10. The LED as claimed in claim 1, wherein the GaN-based semiconductor layers are a-plane GaN-based semiconductor layers grown using an r-plane sapphire substrate or a-GaN substrate as the non-polar substrate.

11. The LED as claimed in claim 7, wherein the GaN-based semiconductor layers are a-plane GaN-based semiconductor layers grown using an r-plane sapphire substrate or a-GaN substrate as the non-polar substrate.

12. The LED as claimed in claim 8, wherein the GaN-based semiconductor layers are a-plane GaN-based semiconductor layers grown using an r-plane sapphire substrate or a-GaN substrate as the non-polar substrate.

13. The LED as claimed in claim 9, wherein the GaN-based semiconductor layers are a-plane GaN-based semiconductor layers grown using an r-plane sapphire substrate or a-GaN substrate as the non-polar substrate.

14. The LED as claimed in claim 1, wherein the GaN-based semiconductor layers are m-plane GaN-based semiconductor layers grown using an m-plane sapphire substrate or m-GaN substrate as the non-polar substrate.

15. The LED as claimed in claim 7, wherein the GaN-based semiconductor layers are m-plane GaN-based semiconductor layers grown using an m-plane sapphire substrate or m-GaN substrate as the non-polar substrate.

16. The LED as claimed in claim 8, wherein the GaN-based semiconductor layers are m-plane GaN-based semiconductor layers grown using an m-plane sapphire substrate or m-GaN substrate as the non-polar substrate.

17. The LED as claimed in claim 9, wherein the GaN-based semiconductor layers are m-plane GaN-based semiconductor layers grown using an m-plane sapphire substrate or m-GaN substrate as the non-polar substrate.

* * * * *